United States Patent [19]

Auracher et al.

[11] Patent Number: 4,748,687
[45] Date of Patent: May 31, 1988

[54] NARROW BAND LASER TRANSMITTER

[75] Inventors: Franz Auracher, Baierbrunn; Hartmut Schneider, Munich; Georg Böeck, Berlin, all of Fed. Rep. of Germany

[73] Assignee: Siemens Aktiengesellschaft, Berlin and Munich, Fed. Rep. of Germany

[21] Appl. No.: 757,444

[22] Filed: Jul. 22, 1985

[30] Foreign Application Priority Data

Sep. 25, 1984 [DE] Fed. Rep. of Germany ....... 3435172

[51] Int. Cl.[4] ............................ H04B 9/00; H01S 3/08
[52] U.S. Cl. .................................. 455/609; 455/612; 370/3; 372/99
[58] Field of Search .................. 370/3; 455/609, 610, 455/612; 350/96.15; 372/97, 98, 99

[56] References Cited

U.S. PATENT DOCUMENTS 4,592,043  5/1986  Williams .............................. 370/3

OTHER PUBLICATIONS

Wijngaard—Guided Normal Niodes—Jour. of Optical Society of America—vol. 63, #8, Aug. 1973, pp. 944–950.
Wyatt et al., "10 kHz Linewidth 1.5 um InGaAsP External Cavity Laser with 55 nm Tuning Range", *Electronics Letters*, Feb. 3, 1983, vol. 19, No. 3, pp. 110–112.
F. Favre et al., "Emission Frequency Stability in Single-Mode-Fibre Optical Feedback Controlled Semiconductor Lasers", *Electronics Letters*, vol. 19, No. 17, Aug. 18, 1983, pp. 663–665.
Payne et al., "Development of Low- and High-Birefringence Optical Fibers", IEEE Journal of *Quantum Electronics*, vol. QE–18, No. 4, Apr. 1982, pp. 477–487.
R. C. Alferness, "Optical Directional Couplers with Weighed Coupling", *Applied Physics Letter*, vol. 35, No. 3, Aug. 1, 1979, pp. 260–262.
Cozens et al., "Co-Axial Optical Couplers", *IEEE First European Conference on Integrated Optics*, Sep. 14–15, 1981, Conference Publication No. 201, pp. 102–106.
G. Schiffner et al., "Double-Core Single-Mode Optical Fiber as Directional Coupler", *Applied Physics*, vol. 23, 1980, pp. 41–45.
H. Schneider et al., "Herstellverfahren und Ausfuhrungsformen von Lichtwellenleitern", *telcom report* 6 (1983), Beiheft Nachrichtenubertragung mit Light, pp. 29–35.
H. Schneider et al., "Manufacturing Processes and Designs of Optical Waveguides", *telcom report* 6 (1983), Special Issue, Optical Communications, pp. 27–33.

Primary Examiner—Michael A. Masinick
Assistant Examiner—Andrew J. Telesz, Jr.
Attorney, Agent, or Firm—Hill, Van Santen, Steadman & Simpson

[57] ABSTRACT

A narrow band laser transmitter comprising a semiconductor laser and an external optical resonator coupled by a coupling arrangement to the semiconductor laser characterized by the external optical resonator being a wavelength-selective fiber directional coupler in the form of a double core fiber whose cores have different refractive index discontinuities to the respective environments and different cross-sections. The laser transmitter is suitable for practical use, has a space-saving structure and is stable in operation.

15 Claims, 2 Drawing Sheets

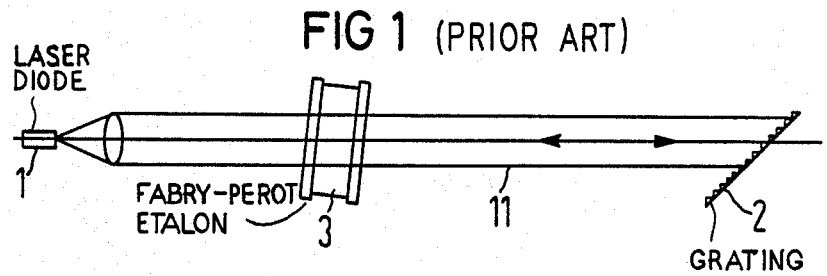
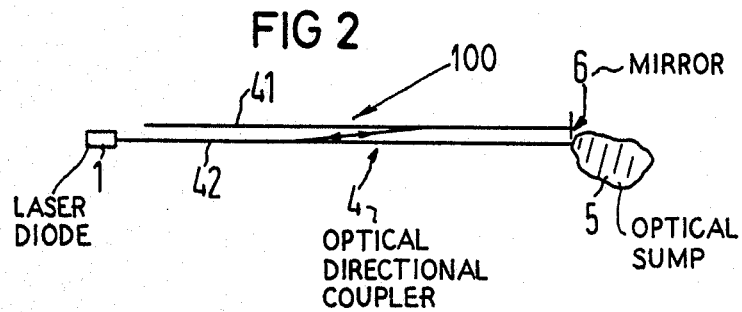
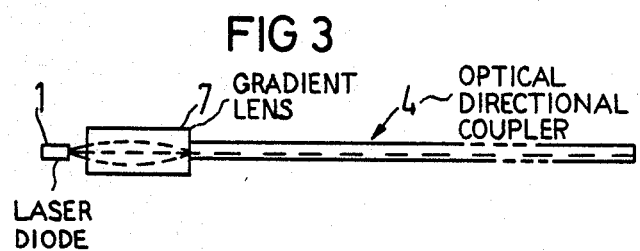
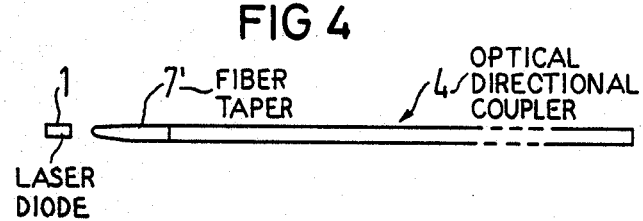

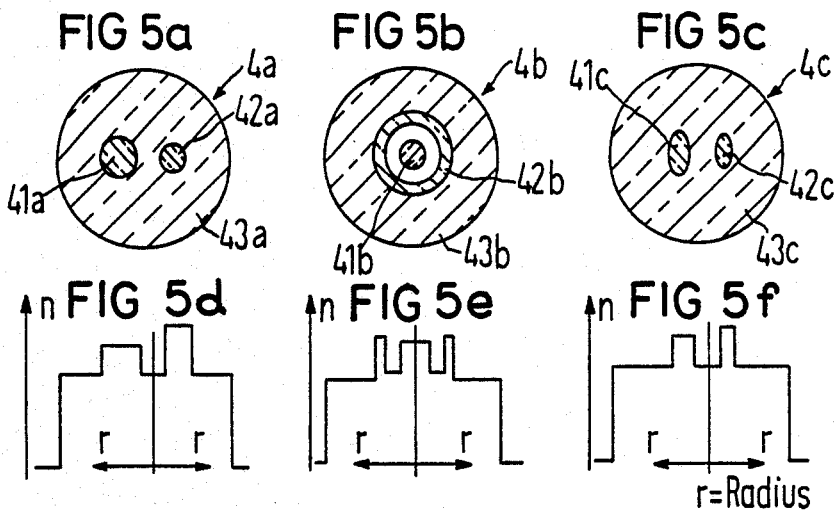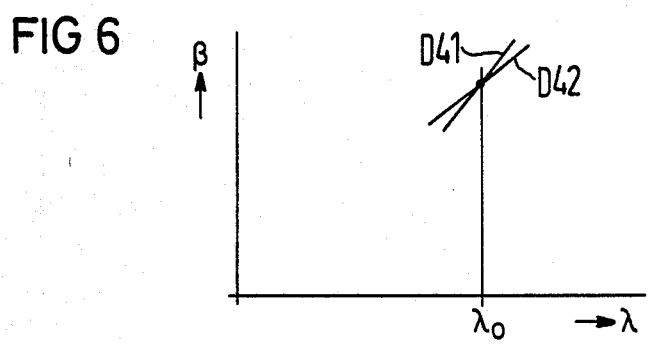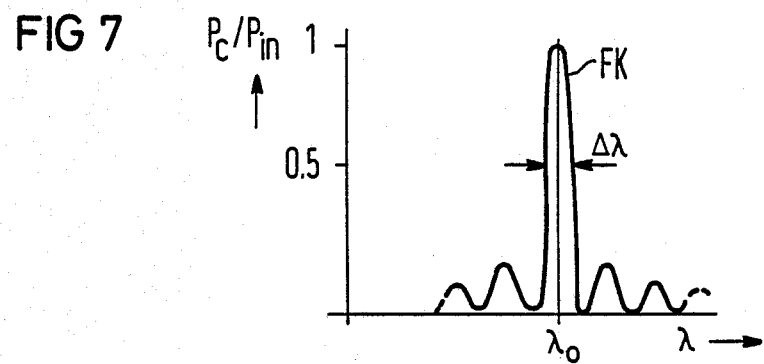

NARROW BAND LASER TRANSMITTER

BACKGROUND OF THE INVENTION

The present invention is directed to a narrow band or narrow line width laser transmitter which comprises a laser, particularly a semiconductor laser, and an external optical resonator coupled to the laser for generating very narrow line widths.

Monomode laser transmitters, which have a very narrow line width, are required in optical transmission systems comprising heterodyne or heterodyne receivers. In laboratory experiments, this is currently achieved with standard semiconductor lasers which are improved in terms of their spectral properties by coupling to an external optical resonator, grating or Fabry-Perot filter. A typical structure of this type comprises an external grating for rough adjustment of the laser wavelength and a Fabry-Perot etalon for fine adjustment as disclosed in an article by R. Wyatt and W. J. Devlin, "10 kHz Linewidth 1.5 $\mu$m InGaAsP External Cavity Laser With 55 nm Tuning Range", *Electronics Letters*, Vol. 19, No. 3, Feb. 3, 1983, pp. 110–112. Since the outlay or cost of this structure is too high and above all else the thermal and mechanical stability of this structure is insufficient, this structure with free beam propagation is unsuitable for practical systems.

A more compact structure having an external fiber resonator is disclosed in an article by F. Favre and D. Le Guen, "Emission Frequency Stability in Single-Mode-Fibre Optical Feedback Controlled Semiconductor Lasers", *Electronics Letters*, Vol. 19, No. 17, Aug. 18, 1983, pp. 663–665. Given this structure, however, the closely adjacent resonances of the external resonator are not selected by a narrow band filter so that the laser transmitter has a tendency to skip between neighboring resonant frequencies.

A common problem with structures having free beam propagation is that they are bulky, expensive and unstable. Therefore, the structures having a free beam propagation do not come into consideration for practical uses.

SUMMARY OF THE INVENTION

The object of the present invention is to create a narrow band laser transmitter, particularly a laser transmitter comprising a semiconductor laser coupled to an external optical resonator, which transmitter is suitable for practical employment, is space-saving and, in particular, is stable.

The object is achieved in an improvement in a narrow band laser transmitter comprising a laser, particularly a semiconductor laser, an external optical resonator, and means coupling the resonator to the laser for generating very narrow line wavelengths. The improvement is that the external optical resonator is composed of a wavelength-selective optical directional coupler.

Given the laser transmitter of the invention, the free beam propagation is abandoned in favor of guided beam propagation in the directional coupler, which enables a stable beam propagation. Further, the structure of the optical directional coupler is compact and space-saving so that the laser transmitter constructed therewith is also correspondingly designed.

A particularly preferred embodiment of the transmitter of the invention is designed utilizing a wavelength-selective fiber directional coupler as the resonator.

Fiber directional couplers can be manufactured in a particularly compact and space-saving way in the form of double core fibers. Accordingly, it is advantageous to employ such a double core fiber for the coupler of the laser transmitter of the invention. Such a transmitter is designed wherein the double core fiber has cores with different refractive index discontinuities to the respective environment and different cross-sections. Examples of such wavelength-selective double core fibers and methods for the manufacture thereof shall be set forth hereinafter.

It is particularly advantageous when, in a laser transmitter of the invention, the waveguide of the wavelength-selective optical directional coupler is executed polarization-preserving. This can be achieved, for example, by means of a shaped double refracting, for example, elliptical cores, for the optical directional coupler or can be achieved by stress induced birefringence. Construction of high and low birefringence optical fibers is discussed in an article by David N. Payne, Arthur J. Barlow and Jens J. Ramskov Hansen, "Development of Low-and High-Birefringence Optical Fibers", *IEEE Journal of Quantum Electronics*, Vol. QE-18, No. 4, April 1982, pp. 477–487.

It is particularly advantageous for achieving extremely narrow line widths to design a laser transmitter in accordance with the present invention so that the waveguide comprises dispersion curves proceeding with different steepness and the curves intersect at the wavelength $\lambda_0$ emitted by the laser. Such a dispersion curve which indicates the dependency of the propagation constant $\beta$ on the wavelength $\lambda$ are attained, for example, given a correct selection of the refractive index profile and of the core cross-section in the fiber directional coupler. A complete over-coupling i.e. crossover from one waveguide onto the other is then possible at the specific wavelength at which the dispersion curves with different steepness intersect, given a properly dimensioned length of the directional coupler so that only a partial over-coupling will occur at different wavelengths.

In some use cases, for example, given employment of this wavelength-selective directional coupler for optical wavelength multiplex transmissions, the partial over-coupling at the other wavelengths are undesired. In order to suppress these partial over-couplings it is expedient to design a laser transmitter of the invention so that the coupling degree varies along the coupling path of the selective wavelength optical directional coupler. Directional couplers having varying coupling degrees along the coupler path are known per se and disclosed in an article by R. C. Alferness, "Optical Directional Couplers With Weighted Coupling", *Applied Physics Letter*, Vol. 35, No. 3, Aug. 1, 1979, pp. 260–262.

A preferred embodiment of the laser transmitter of the invention, has one of the waveguides of the wavelength-selective optical coupler being coupled to the laser and the other waveguide is mirrored at the end of the directional coupler remote from the laser. The emission of the laser in the proximity of the specific wavelength at which the dispersion curves intersect is then reflected back into the laser source whereas the other wavelengths are absorbed in an optical sump at the remote end of the directional coupler.

The coupling of the directional coupler to the transmitter can occur in various ways. For example, the laser may be coupled via a gradient or graded index lens to one waveguide of the wavelength-selective optical directional coupler. In another embodiment, the laser is coupled via a fiber taper with a fused lens to the one waveguide of the wavelength-selective optical directional coupler. In general, it is advantageous given the inventive transmitter for the light exit face of the laser and the light entrance face of the coupling optics for coupling the laser to the one waveguide of the wavelength-selective optical directional coupler to each be provided with an antireflection coating.

BRIEF DESCRIPTION OF THE DRAWINGS

FIG. 1 is a schematic illustration of the typical structure for a laser transmitter of the prior art;

FIG. 2 is a schematic illustration of a laser transmitter in accordance with the present invention which has an external resonator in the form of a wavelength-selective optical directional coupler;

FIG. 3 is a view of a laser transmitter in accordance with the present invention with the wavelength-selective optical directional coupler being coupled to the laser by a gradient lens;

FIG. 4 is a view of a laser transmitter of the present invention with the wavelength-selective optical directional coupler being connected to the laser by a fiber taper;

FIGS. 5a, 5b and 5c are cross-sectional views of three different embodiments of the wavelength-selective fiber directional coupler having a double core fiber construction with FIGS. 5d, 5e and 5f being a radial refractive index profile for the cores with FIG. 5d being a profile for the fiber of FIG. 5a and FIG. 5e being a profile for the fiber of FIG. 5b and FIG. 5f being a profile for the fiber of FIG. 5c;

FIG. 6 is a diagram illustrting dispersion curves for the two waveguides showing the propagation constant versus wavelength; and FIG. 7 is a curve showing the ratio of power coupled between the fibers relative to power from the laser plotted against wavelength.

DESCRIPTION OF THE PREFERRED EMBODIMENTS

A known laser transmitter, as illustrated in FIG. 1, includes a laser diode 1 producing laser light emitted in a beam path 11. A blazed grating 2, which serves for the rough adjustment of the laser light, is disposed in the beam path 11 and a Fabry-Perot etalon 3, which serves for fine adjustment, is disposed in the path 11 between the grating 2 and the diode 1.

The principles of the present invention are particularly useful in a laser transmitter generally indicated at 100 in FIG. 2 which is composed of a laser diode 1 and a wavelength-selective optical directional coupler 4. The coupler is composed of two optical waveguides 41 and 42 along which a wavelength-selective over-coupling will occur. The laser diode 1 is coupled to one waveguide 42 which discharges into an optical sump 5 at an end remote to the laser diode 1. The other waveguide 41 is terminated at an end remote to the laser diode by a mirror 6 which reflects the supplied light back into the waveguide 41.

The over-coupling between the waveguides 41 and 42 occurs essentially only in the proximity of the specific wavelength $\lambda_0$. When the laser emission, which contains a specific wavelength $\lambda_0$, is coupled into the directional coupler 4, then it is essentially only the laser emission in the proximity of the specific wavelength $\lambda_0$ which proceeds to the mirror 6 from which it is reflected back into the laser diode 1. The laser emissions at other wavelengths are absorbed in the optical sump 5.

The laser 1 is coupled to a waveguide of the directional coupler 4 by means of a coupler which as illustrated in FIG. 3 is a gradient lens 7. The lens 7 can also be a section of multimode gradient fiber or graded index fiber of a suitable length. It can, for example, be permanently bonded or welded or fused to the wavelength-selective optical directional coupler which preferably is a fiber-directional coupler.

Instead of utilizing a gradient lens 7 as means for coupling, a fiber taper 7' with a fused lens can be utilized as illustrated in FIG. 4. The fiber taper 7' having a fused lens can be a section of tapered monomode fiber. Given a fiber-directional coupler having a rotational symmetric structure, for example, in the form of a double core fiber with one core being concentric of another, the directional coupler itself can be drawn or etched taper-like and a small lens can be fused to it. In general, it is advantageous when the exit mirror of the laser and the entrance surface of the coupling optic are each provided with an antireflection coating for coupling the light of the laser to the directional coupler with a minimum of reflection.

The wavelength-selective optical directional coupler 4 can be realized by a wavelength-selective fiber-directional coupler. It is thereby advantageous to realize it by a double core fiber wherein the spacing between the fiber cores which are represented as waveguides 41 and 42 is selected such that a coupling between the two waveguides of the double core fiber will occur.

Two cores of a double core fiber have different refractive index discontinuities to their respective environments and have different cross-sections. The refractive index discontinuities can be generated by different doping, for example, by different dopant concentrations or different dopants. Examples of such suitable double core fibers are illustrated by the fiber couplings 4a, 4b and 4c in FIGS. 5a–5c.

A double core fiber 4a of FIG. 5a has two cores 41a and 42a which are circular in cross-section and have different diameters and are surrounded by a common jacket 43a. The diameter of the core 41a, for example, is larger than the diameter of the core 42a. In addition, the core 42a has a higher refractive index discontinuity to the surrounding jacket 43a than the core 41a. The relationship of the refractive index n relative to the radial distance r from the axis of the fiber 4a is illustrated in the graph of FIG. 5d.

The double core fiber 4b is illustrated in FIG. 5b and has a rotationally symmetric structure. A central core 41b is surrounded at a distance by a core 42b which has an annular cross-section which in turn is surrounded by a jacket 43b. A radial refractive index profile for the fiber 4b is illustrated in FIG. 5e and clearly shows that the two cores 41b and 42b have different refractive index discontinuities to their respective environment. A directional coupler such as the coupler 4b is disclosed in an article by J. R. Cozens, A. C. Boucouvales and N. L. Webster, "Co-Axial Optical Couplers", *IEE First European Conference On Integrated Optics*, Sept. 14–15, 1981, Conference Publication No. 201, pp. 102–106.

Another example of a double core fiber is illustrated in FIG. 5c by the fiber 4c. The fiber 4c has two cores 41c and 42c which are surrounded by a common jacket 43c. The sole difference between the structure of the fiber 4c and the fiber 4a is that the cores 41c and 42c have an oval or elliptical cross-section.

The directional couplers 4a, 4b and 4c can be obtained from corresponding preforms by drawing which can, for example, be manufactured according to known Modified Chemical Vapor Deposition methods (MCVD methods) which are discussed in an article by H. Schneider and G. Zeidler, "Herstellverfahren und Ausfuhrungsformen von Lichtwellenleitern", *telcom report* 6 (1983), Beiheft "Nachrichtenubertragung mit Licht", pp. 29–35. Two single core preforms are expediently employed for the preparation of the fibers 4a and 4c. These two single preforms are bonded together after a single side grinding to form a double core preform as disclosed in the article by G. Schiffner et al, "Double-Core Single-Mode Optical Fiber as Directional Coupler", *Applied Physics*, Vol. 23, 1980, pp. 41–45. Sufficient for the manufacture of the concentric fiber-type 4b of FIG. 5b is one preform whose refractive index profile is produced in a fundamentally known fashion by variation of the dopant gas concentration in the deposition from the gas phase. A high dimensional stability can be anticipated and manufactured particularly from this type of fiber.

It is particularly advantageous when the waveguides of the directional coupler are designed polarization-preserving. This can, for example, be achieved by means of a shape birefringence on the basis of an elliptical shape of the cores shown, for example, at the double core fiber 4c or as known, can be achieved by a stress-induced birefringence. Given proper selection of the refractive index profile and of the core cross-section, section, one can then obtain dispersion curves D41 and D42 which proceed with different steepness for the two waveguides and which intersect at a specific wavelength $\lambda_0$ as illustrated in the diagram or graph of FIG. 6 wherein the propagation constant $\beta$ is plotted against the wavelength. Given a proper dimensional length of the directional coupler, a complete over-coupling or transfer of guided light power from one waveguide onto the other is then possible at a specific wavelength $\lambda_0$ whereas only a partial over-coupling will occur for other wavelengths. A typical curve of the over-coupling dependent on the wavelength is shown in the graph or diagram of FIG. 7 wherein a curve FK illustrates the ratio between over-coupling power $P_c$ to coupled-in power $P_{in}$ relative to the wavelength.

In some uses, for example, given employment of the wavelength-selective optical directional couplers for optical waveguide multiplex transmissions, the secondary maxima in the transmission curve FK of FIG. 7 are undesired. In order to suppress the secondary maxima, the coupling degree or strength along the coupling path of the directional coupler must be varied. Varying of the coupling degree is disclosed in the article by R. C. Alferness, "Optical Directional Couplers with Weighted Coupling", *Applied Physics Letter*, Vol. 35, No. 3, Aug. 1, 1979, pp, 260–262. This weighted coupling can occur during manufacture of the preform, for example, either by grinding a suitable profile of the two single-core preforms or by variation of the deposition parameters along the preform axis when using an MCVD method. In addition, the weighted coupling can be produced in the fiber directional coupler itself by means of an post-treatment, for example, by means of an ion exchange process.

The width of the transmission or, respectively, fiber curve FK of FIG. 7 decreases with the increased length of the directional coupler and with increasingly different slopes of the dispersion curves D41 and D42 of FIG. 6. When, as described in conjunction with FIG. 2, one waveguide of the directional coupler is coupled to the laser and the other waveguide is mirrored at the end of the directional coupler, when the laser emission in the proximity of the specific wavelength $\lambda_0$ is reflected back into the laser whereas other wavelengths will be absorbed in an optical sump 5 at the end of the directional coupler 4.

Although various minor modifications may be suggested by those versed in the art, it should be understood that we wish to embody within the scope of the patent granted hereon, all such modifications as reasonably and properly come within the scope of our contribution to the art.

We claim:

1. In a narrow band laser transmitter comprising a semiconductor laser, an external optical resonator and means for coupling the laser to the resonator for generating very narrow line widths, the improvement comprising said external optical resonator being composed of a wavelength-selective optical directional coupler having two waveguides, one of the two waveguides being coupled to the laser with an end face of the one waveguide lying close to the laser, and the other of the two waveguides having an end remote from the laser being provided with a mirror.

2. In a narrow band laser transmitter according to claim 1, wherein the wavelength-selective optical directional coupler is composed of a wavelength-selective fiber directional coupler.

3. In a narrow band laser transmitter according to claim 2, wherein said two waveguides are formed by a double core fiber whose cores have different refractive index discontinuities to their respective environments and different cross-sections.

4. In a narrow band laser transmitter according to claim 3, wherein the wavelength-selective optical directional coupler is designed with the waveguides having dispersion curves proceeding with different slopes and said curves intersect at a specific wavelength emitted by the laser.

5. In a narrow band laser transmitter according to claim 4, wherein the means for coupling includes a gradient lens interposed between one core and the laser.

6. In a narrow band laser transmitter according to claim 4, wherein the means for coupling includes a fiber tape with a fused lens being connected to one core for conducting light from the laser into the one core.

7. In a narrow band laser transmitter according to claim 3, wherein said wavelength-selective optical directional coupler is executed in a polarization-preserving fashion.

8. In a narrow band laser transmitter according to claim 7, wherein a coupling degree along a coupling path of the wavelength-selective optical directional coupler is varied.

9. In a narrow band laser transmitter according to claim 7, wherein the means for coupling includes a gradient lens between one core of the wavelength-selective fiber optical directional coupler and the semiconductor laser.

10. In a narrow band laser transmitter according to claim 7, wherein the means for coupling includes a fiber tape with a fused lens being connected to one core of the wavelength-selective optical fiber coupler.

11. In a narrow band laser transmitter according to claim 7, wherein the laser has an exit face and the core of the one waveguide has an light entrance face and said faces are provided with antireflection coatings.

12. In a narrow band laser transmitter according to claim 3, wherein the double core fiber has a pair of cores extending parallel to each other with a common cladding, one of said cores having a larger circular cross-section than the other core.

13. In a narrow band laser transmitter according to claim 3, wherein the double core fiber includes a pair of cores extending parallel to each other within a common cladding, each of said cores having an elliptical cross-section with one of the cores being larger than the other.

14. In a narrow band laser transmitter according to claim 3, wherein the double core fiber has one core having an annular cross-section with the other core being concentrically arranged therein.

15. In a narrow band laser transmitter according to claim 2, wherein the fiber directional coupler exhibits a rotationally symmetric structure.

* * * * *